(12) United States Patent
Cooke

(10) Patent No.: US 8,193,686 B2
(45) Date of Patent: Jun. 5, 2012

(54) GAS PRESSURIZED ENCAPSULATION FOR AN ACTUATOR

(75) Inventor: Michael Peter Cooke, Gillingham (GB)

(73) Assignee: Delphi Technologies Holding S.arl, Troy, MI (US)

( * ) Notice: Subject to any disclaimer, the term of this patent is extended or adjusted under 35 U.S.C. 154(b) by 274 days.

(21) Appl. No.: 12/319,574

(22) Filed: Jan. 9, 2009

(65) Prior Publication Data

US 2009/0174290 A1 Jul. 9, 2009

(30) Foreign Application Priority Data

Jan. 9, 2008 (EP) ..................................... 08100285

(51) Int. Cl.
*H01L 41/053* (2006.01)
(52) U.S. Cl. ....................................................... 310/348
(58) Field of Classification Search .................. 310/328, 310/340, 344, 348
See application file for complete search history.

(56) References Cited

U.S. PATENT DOCUMENTS

| 5,113,108 A * | 5/1992 | Yamashita et al. ............ 310/328 |
| 2003/0015939 A1 * | 1/2003 | Yamada ........................ 310/328 |
| 2003/0107301 A1 * | 6/2003 | Asano et al. .................. 310/328 |
| 2004/0217672 A1 * | 11/2004 | Bindig et al. ................. 310/344 |
| 2007/0024160 A1 * | 2/2007 | Denzler et al. ................ 310/340 |

FOREIGN PATENT DOCUMENTS

| JP | 51-85390 | 10/1975 |
| JP | 2-42457 | 3/1990 |
| JP | 4-349675 | 12/1992 |
| WO | 2007/063284 | 6/2007 |

OTHER PUBLICATIONS

Machine translation of DE10356959 provided by the website of the European Patent Office.*
Japan Office Action dated Aug. 15, 2011.

* cited by examiner

*Primary Examiner* — Derek Rosenau
(74) *Attorney, Agent, or Firm* — Thomas N. Twomey

(57) ABSTRACT

A piezoelectric actuator for use in a diesel engine. The actuator comprises a piezoelectric element which is encapsulated such that a layer of gas at a pressure above atmospheric pressure surrounds the piezoelectric element. The presence of the gas within the encapsulation around the element avoids the need to passivate electrodes exposed on the surface of the element.

12 Claims, 2 Drawing Sheets

GAS PRESSURIZED ENCAPSULATION FOR AN ACTUATOR

TECHNICAL FIELD

The present invention relates to an encapsulation for a piezoelectric actuator for use in a fuel injector. In particular, the present invention relates to an encapsulation that is provided internally with a gas at a pressure above atmospheric pressure.

BACKGROUND OF THE INVENTION

Piezoelectric actuators are known to fail through a number of modes. For example short circuit failures are known to occur as a result of electrochemical ion migration due to the presence of water. They may also fail from surface flash-over, where internal electrodes of the same polarity are exposed at the surface of the piezo stack. This is exacerbated by contamination of the surface of the piezo stack with conductive materials. They may also fail by reduction of the insulating lead oxide in the grain boundaries of the commonly used lead zirconate titanate (PZT) material to form (conductive) lead metal.

It is not possible to completely eliminate water from the PZT material during manufacture as even firing at high temperature for prolonged periods leaves small traces. Also, the materials, for example polymers, used to passivate the exposed internal electrodes may contain water and other sources of hydrogen.

Therefore, there is a need for a method of encapsulating an actuator which eliminates or significantly reduces failure of an actuator through the above-mentioned failure modes.

SUMMARY OF THE INVENTION

Accordingly, the present invention provides a piezoelectric actuator, for use in a fuel injector of an internal combustion engine, comprising a piezoelectric element encapsulated within an encapsulation (5), wherein within the encapsulation there is a jacket of gas at least partially surrounding the piezoelectric element and wherein the gas is at a pressure above atmospheric pressure. If a piezoelectric is operated in a pressurised gas environment there is no need to passivate the exposed electrodes connected to the piezoelectric element because the dielectric strength of gasses increases with their pressure. Surrounding a piezoelectric element with a gas, rather than a solid, also enables damaging materials such as water and hydrogen to migrate out of the actuator throughout its life. In addition, the thermal conductivity of the gas is increased when it is pressurised which enables the gas to better dissipate the heat generated by the piezoelectric element away from it. Furthermore, as the gas will be circulated within the encapsulation by convection currents any damaging fluids on the surface of the piezoelectric element will be distributed within the gas reducing the potential to cause failure of the piezoelectric element.

Preferably, the permeability of the encapsulation is low. More preferably the encapsulation is impermeable. The lowest possible permeability is desirable to reduce the ingress of fluids, in particular water, into the inside of the encapsulation.

Preferably, the encapsulation is flexible so that in use the piezoelectric element may expand and contract.

Preferably, the encapsulation is provided with a hermetically sealable gas connection so that gas may be introduced into the encapsulation.

Preferably, the gas connection is provided with a permanent hermetic seal. Preferably, the seal is formed by crimping and welding. However, the seal may be formed by, for example, soldering, brazing or with an adhesive.

Alternatively, the gas connection may be provided with a temporary hermetic seal. For example, the temporary seal could be a non-return valve or a stopper.

Preferably, a chemically active substance is provided inside the encapsulation, wherein, in use, the substance chemically combines with water to form a compound. Metals or metal oxides, such as Calcium and Calcium oxide can be used to chemically remove water vapor.

Preferably, a chemically active substance is provided inside the encapsulation, wherein, in use, the substance chemically combines with hydrogen to form a compound. Hydrogen can be stored in a metal hydride form. In order that the Hydrogen is not released from the metal hydride form during normal actuator operation it is important to choose a metal hydride that will only release hydrogen at a temperature above the actuators normal operating temperature of around 90 degrees Celsius. A suitable reaction is:

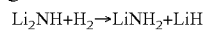

Up to 6.5% Hydrogen by weight can be stored and this Hydrogen is not released until the temperature rises above 200 degrees Celsius. Magnesium and Nickel based hydrides are also suitable.

Preferably, two or more different chemically active substances may be located at different places within the encapsulation. This will prevent the occurrence of any reaction between different substances. Also, it enables the chemically active substances to be placed in the location where they will be most effective. For example, a hydrogen removing substance could be placed adjacent to the top surface of the encapsulation as this is where Hydrogen will tend to collect, as it is a relatively light gas. A water removing substance could be placed adjacent to the bottom surface of the encapsulation as this is where condensed water would tend to collect.

In one embodiment the gas may be a mixture of gasses including oxygen. The percentage of oxygen within the mixture of gasses may be greater than the percentage of oxygen within atmospheric air. For example, such an oxygen enriched mixture of gasses may contain a percentage of oxygen by volume that is greater than 22% or a percentage of oxygen by mass that is greater than 24%. Alternatively, the gas may be oxygen.

It is advantageous for the gas to be oxygen or to contain oxygen as this helps to oxidise any lead formed on the grain boundaries of the PZT and thus prevents reduction of the insulating lead oxide on those grain boundaries to lead. Dry air or a mixture of oxygen with an inert gas such as argon could be used.

BRIEF DESCRIPTION OF THE DRAWINGS

A preferred embodiment of the present invention will now be described with reference to the accompanying drawings in which.

BEST MODE FOR CARRYING OUT THE INVENTION

Figure 1:
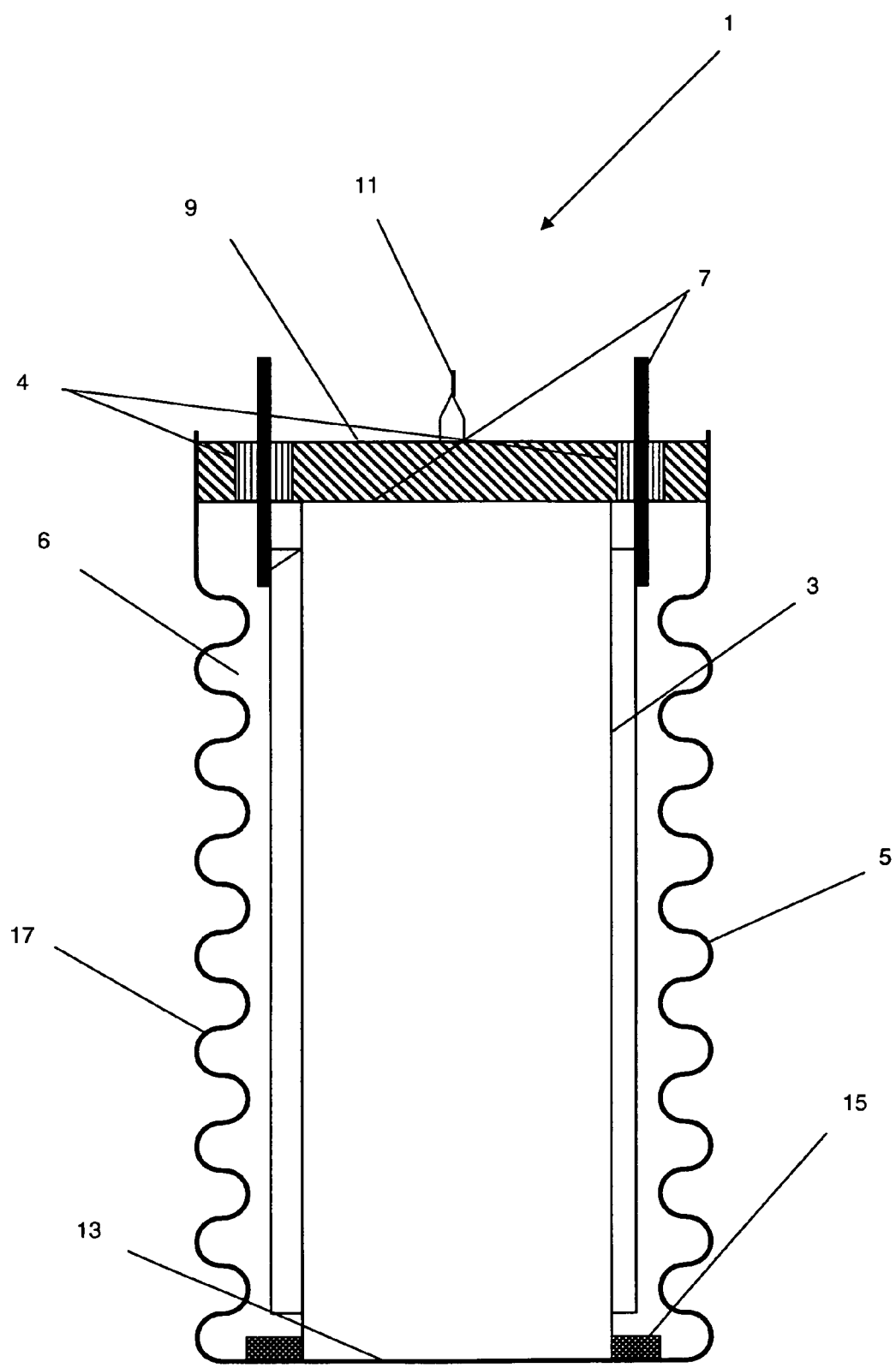
FIG. 1 is a schematic cross-sectional elevation of an encapsulation according to the preferred embodiment of the present invention.
Figure 2:
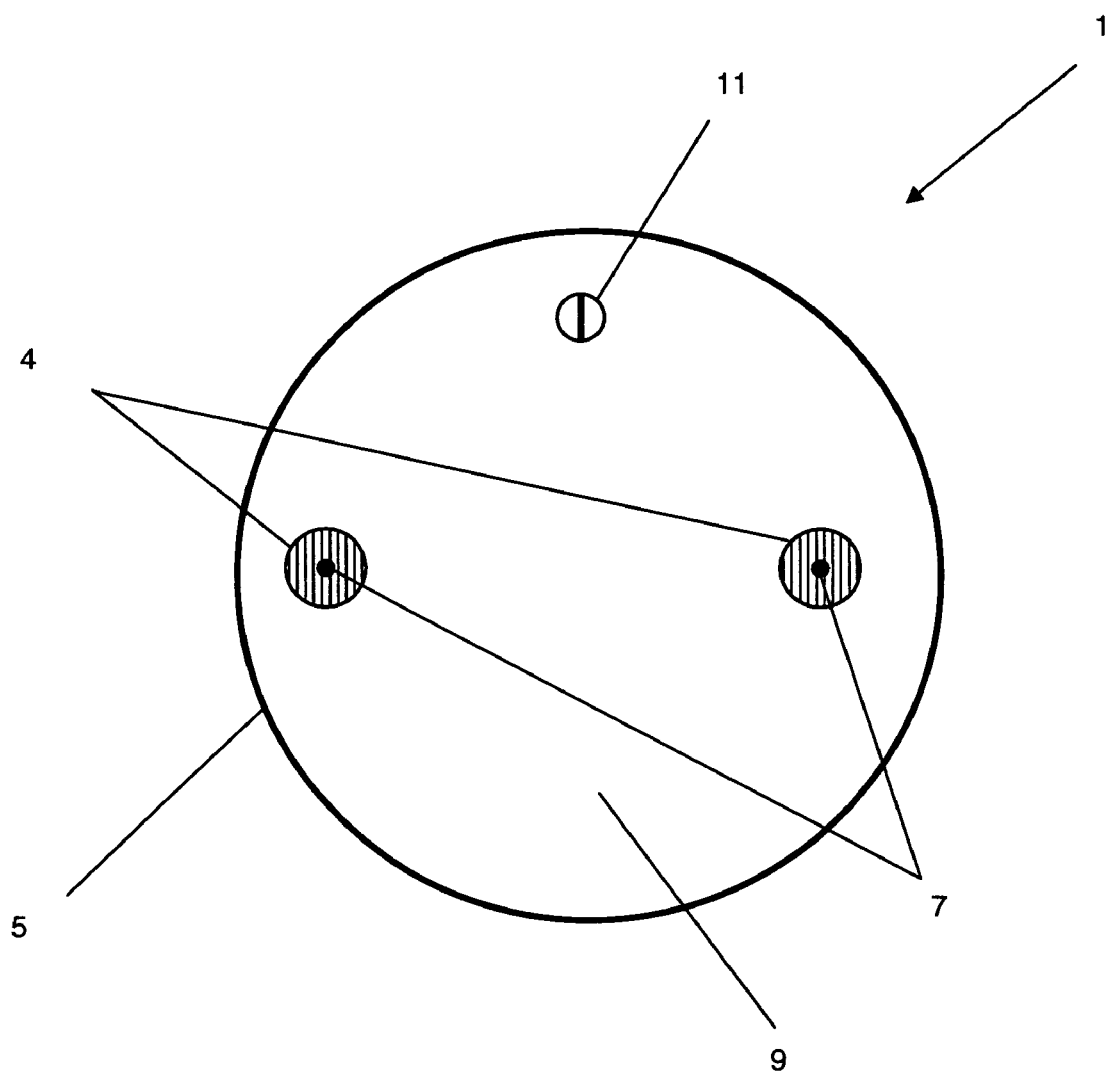
FIG. 2 is a top plan view of the encapsulation of FIG. 1.

The piezoelectric actuator 1 comprises a piezoelectric element 3 located within an elongate cylindrical encapsulation 5 and surrounded by a pressurised gas 6. In this preferred embodiment the piezoelectric actuator 1 is a monotholic actuator formed from a single block of co-fired ceramic and electrode layers. Two electrical connections 7 pass through a top surface 9 of the encapsulation 5. A hermetically sealable gas connection 11 is also provided on the top surface 9. Within the encapsulation 5, on a bottom surface 13, is located a chemically active substance 15.

The piezoelectric element 3 is of the lead zirconate titanate (PZT) type.

The encapsulation 5 is made from stainless steel and is provided with corrugations 17 which enable it to expand or contract in length in a direction along its longitudinal axis.

The electrical connections 7 are sealed to the top surface 9 using low permeability seals 4 formed by glass beads fused between the connections 7 and the top surface 9.

The gas connection 11 is formed from a stainless steel tube which is crimped shut after the gas has been introduced into the encapsulation 5 and then welded at the crimped end.

The chemically active substance 15 is provided inside the encapsulation 5 in a solid form.

The encapsulation 5 is filled with pressurised oxygen. However, before filling the encapsulation 5 with pressurised oxygen it is evacuated and/or heated to remove the maximum amount of water possible. The encapsulation 5 is also heated after being filled with pressurised oxygen, either before or after the gas connection 11 is sealed, in order to oxidise any surface contaminants on the actuator 1.

The invention claimed is:

1. A piezoelectric actuator comprising a piezoelectric element encapsulated within an encapsulation, wherein the piezoelectric element comprises a piezoelectric material, and wherein within the encapsulation there is a gas at least partially surrounding and in direct contact with the piezoelectric material and wherein the gas is at a pressure above atmospheric pressure.

2. A piezoelectric actuator as claimed in claim 1 wherein the permeability of the encapsulation is low.

3. A piezoelectric actuator as claimed in claim 1 wherein the encapsulation is flexible.

4. A piezoelectric actuator as claimed in claim 1 wherein the encapsulation is provided with a hermetically sealable gas connection.

5. A piezoelectric actuator as claimed in claim 4 wherein the gas connection is provided with a permanent hermetic seal.

6. A piezoelectric actuator as claimed in claim 4, wherein the connection is provided with a temporary hermetic seal.

7. A piezoelectric actuator as claimed in claim 1 wherein a chemically active substance is provided inside the encapsulation, wherein, in use, the substance chemically combines with water to form a compound.

8. A piezoelectric actuator as claimed in claim 1 wherein a chemically active substance is provided inside the encapsulation, wherein, in use, the substance chemically combines with hydrogen to form a compound.

9. A piezoelectric actuator as claimed in claim 1 wherein two or more different chemically active substances may be located at different places within the encapsulation.

10. A piezoelectric actuator as claimed in claim 1 wherein the gas is a mixture of gasses including oxygen.

11. A piezoelectric actuator as claimed in claim 10 wherein the percentage of oxygen within the mixture of gasses is greater than the percentage of oxygen within atmospheric air.

12. A piezoelectric actuator as claimed in claim 1 wherein the gas is oxygen.

* * * * *